United States Patent
Kasukawa et al.

[11] Patent Number: 5,929,462
[45] Date of Patent: *Jul. 27, 1999

[54] SEMICONDUCTOR OPTICAL DEVICE HAVING A STRAINED QUANTUM WELL STRUCTURE

[75] Inventors: Akihiko Kasukawa, Tokyo; Michio Ohkubo; Nobumitsu Yamanaka, both of Kanagawa, all of Japan

[73] Assignee: The Furukawa Electric Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/653,755

[22] Filed: May 23, 1996

[30] Foreign Application Priority Data

May 23, 1995 [JP] Japan ................................. 7-148188

[51] Int. Cl.$^6$ ..................... H01L 31/0304; H01L 31/036; H01L 29/205; H01L 29/15
[52] U.S. Cl. .............................. 257/18; 257/14; 257/15; 257/21; 257/22; 257/190
[58] Field of Search ................................ 257/14, 15, 18, 257/21, 22, 190

[56] References Cited

U.S. PATENT DOCUMENTS

| | | | |
|---|---|---|---|
| 5,061,970 | 10/1991 | Goronkin | 257/22 |
| 5,355,000 | 10/1994 | Delacourt et al. | 257/14 |
| 5,481,397 | 1/1996 | Burt | 257/14 |
| 5,495,115 | 2/1996 | Kudo et al. | 257/18 |
| 5,506,418 | 4/1996 | Bois et al. | 257/22 |
| 5,521,397 | 5/1996 | Zhang | 257/18 |

*Primary Examiner*—Jerome Jackson, Jr.
*Attorney, Agent, or Firm*—Helfgott & Karas, PC.

[57] ABSTRACT

A semiconductor laser has a multiple-quantum well (MQW) structure overlying a first III–V compound semiconductor. The MQW includes a plurality of layer combinations including a strained well layer and a strained barrier layer, which are formed in a cyclic order. An ultra-thin intermediate film made of the first III–V compound semiconductor and having a thickness corresponding to from monoatomic layer to ten atomic layer is interposed between each strained well layer and each strained barrier layer. The intermediate film functions for preventing formation of mixed crystal formed between the well layer and the barrier layer, thereby improving current density threshold and other characteristics of the semiconductor laser.

12 Claims, 6 Drawing Sheets

SEMICONDUCTOR OPTICAL DEVICE HAVING A STRAINED QUANTUM WELL STRUCTURE

BACKGROUND OF THE INVENTION (a) Field of the Invention

The present invention relates generally to a semiconductor optical device having a strained quantum well structure and, more particularly, to a semiconductor optical device including a strained quantum well structure having superior crystal interfaces and excellent crystallinity.

(b) Description of the Related Art

A semiconductor optical device having a strained quantum well structure, in which a plurality of III–V compound semiconductor active layers having different compositions are laminated on a III–V compound semiconductor substrate, is widely used as a semiconductor light emitting device, a semiconductor optical amplifier, a semiconductor light receiving device or the like.

In the strained quantum well structure, compressive and tensile strains are applied to the active layers of the quantum well structure. That is, a quantum well layer and a barrier layer, which constitute the quantum well structure as combined, are formed as a compressive strained layer and a tensile strained layer, respectively, or vice versa. The strained quantum well structure has been proposed in order to provide a semiconductor optical device having a lower threshold and improved characteristics to enhance the performance and functions of optical communication devices and optical communication networks.

A semiconductor optical device having a conventional strained quantum well structure will be described first. Referring to FIG. 1, a semiconductor optical device 80 having a conventional strained quantum well structure includes an n-type InP buffer layer 84, a multiple-quantum well (hereinafter referred to as an "MQW") structure 86, a p-type InP cladding layer 88 and a p-type GaInAs contact layer 90, which are laminated in this order on an n-type InP substrate 82. The MQW 86 has a strained structure in which a combination of a 20 nm-thick undoped $In_{1-X}Ga_XP$ (X=0.08) layer 92 and a 10 nm-thick undoped $InAs_YP_{1-Y}$ (Y=0.45) layer 94 is laminated for five times, for example, in a cyclic order.

In the MQW 86 of the semiconductor optical device 80, each $InAs_YP_{Y-1}$ (Y=0.45) layer 94 forming the quantum well layer has a compressive strain of 1.45% acting parallel to the main surface of the substrate while each $In_{1-X}Ga_XP$ (X=0.08) layer 92 forming the barrier layer has a tensile strain of 0.56% acting parallel to the main surface of the substrate, whereby the strained quantum well structure is obtained in which the strains of the compound semiconductor crystal layers having different compositions are counterbalanced. Contrary to the above example, the strained quantum well structure may also be constructed such that each quantum well layer forms a tensile-strained layer while each barrier layer forms a compressive-strained layer.

Due to the strain compensation in the layer combinations, the net strain is theoretically reduced down to 0.11% in the quantum well structure, so that a strained multiple-quantum well structure can be obtained in which the layer combinations each including the quantum well layer and the barrier layer can be theoretically laminated for as high as about 50 times without degradation.

However, the conventional strained quantum well structure as described above will not actually exhibit superior crystallinity and laser characteristics. For example, if a sample semiconductor optical device having the conventional strained quantum well structure is actually manufactured and the crystal planes of the compressive-strained layer and the tensile-strained layer of the strained quantum well structure are inspected, it will be revealed that the crystal planes are rough and hence a superior crystal interface is not formed between the compressive-strained layer and the tensile-strained layer. In addition, if photoluminescence is measured for evaluation of the crystallinity, it will be also revealed that the half-width of the spectrum is almost double the theoretical value of an ideal strained quantum well structure.

In short, it is difficult to obtain excellent laser characteristics in an actual product including a strained quantum well structure.

In the present specification, the term "crystallinity" means the regularity of the arrangement of atoms forming a crystal structure. Therefore, if the amount of crystal defects in the crystal structure are insignificant for device characteristics, it can be recited that the crystal has a superior or excellent crystallinity.

SUMMARY OF THE INVENTION

In view of the foregoing, it is an object of the present invention to provide a semiconductor optical device which includes a strained quantum well structure having both excellent crystallinity and superior crystal interface and hence exhibits excellent device characteristics.

We have carried out studies on the strained quantum well structure while paying attention to the facts that, when the crystal planes of the compound semiconductor active layers are rough, a superior interface cannot be formed between the compound semiconductor active layers, and that this problem is especially remarkable in strained quantum well structures. Further, as the number of quantum layers is increased, the crystallinity is further degraded.

We finally found that in the conventional semiconductor optical device as described above, when a plurality of layer combinations each including an InAsP layer formed as a compressive-strained layer and an InGaP layer formed as a tensile-strained layer are laminated one on another to form an MQW, a thin film made of GaInAsP, the composition of which is not controlled from outside, is formed in the crystal interface between the InAsP layer and the InGaP layer. We reasoned that the GaInAsP layer having an uncontrolled composition had degraded the crystallinity of the layer formed on the GaInAsP layer.

As a result of carrying out various experiments for solving the problem associated with the conventional semiconductor optical device, it was found that the interposition of InP layer having a thickness corresponding to a few atomic layers between the InAsP layer and the InGaP layer of the MQW formed on the InP substrate is effective for improving both the crystallinity and the crystal interface.

That is, an excellent result was obtained from a process in which, upon completion of the growth of an InAsP layer up to a predetermined thickness, an InP layer having a thickness corresponding to several atomic layers was grown and then an InGaP layer was grown. By employing the process, both the crystallinity of the InAsP layer and the InGaP layer and the crystal interface therebetween could be improved.

The present invention provides a semiconductor optical device having a strained quantum well structure, in which a plurality of binary compound semiconductor active layers having different compositions are laminated on a III–V compound semiconductor substrate. The semiconductor device includes an ultra-thin film made of a binary compound semiconductor (hereinafter referred to as a "binary ultra-thin film") having the same composition as that of the substrate and interposed between the compound active layers constituting the strained quantum well structure.

In a preferred embodiment, another binary ultra-thin film is interposed between the lowermost compound semiconductor active layer and the substrate in addition to the binary ultra-thin film interposed between the active layers constituting the strained quantum well structure.

In the strained quantum well structure of the semiconductor optical device according to the present invention, a quantum well layer is a compressive-strained layer applied with a compressive strain acting parallel to the main surface of the substrate while a barrier layer is a tensile-strained layer applied with a tensile strain acting parallel to the main surface of the substrate, or vice versa.

Compound semiconductor substrates suitable for use in the semiconductor optical device of the present invention are III–V compound semiconductor substrates such as an InP substrate, a GaAs substrate and a GaP substrate. Compound semiconductor active layers which can be used in the present invention are III–V compound semiconductor layers. Examples of such III–V compound semiconductor layers include binary compound layers such as InP layer, GaAs layer and GaP layer, ternary mixed crystal layers such as InAsP layer, InGaP layer, InGaAs layer, GaAsP layer and InAlAs layer, and quaternary mixed crystal layers such as InGaAsP layer and InGaAlAs layer.

The composition of the binary compound semiconductor ultra-thin film is selected to be same as that of the substrate because it is easy to obtain lattice matching by this configuration and hence the crystal can be readily grown.

Since the thickness of the binary compound semiconductor ultra-thin film is extremely low in the order of atomic layers, the binary ultra-thin film scarcely affects or degrades the original function of the strained quantum well structure and the interaction between the compressive-strained layer and the tensile-strained layer. The thickness of the binary ultra-thin film depends on the composition, the thickness etc. of the compressive-strained layer and the tensile-strained layer constituting the strained quantum well structure. Accordingly, the thickness of the binary ultra-thin film should be actually determined by experiments.

In a preferred embodiment of the present invention, the binary ultra-thin film is not formed in more than ten atomic layers while in the case of eleven or more atomic layers, the efficiency of injected current greatly decreases and in the case of of ten or less atomic layers, the efficiency of injected current is approximately equal to that of the conventional strained quantum well structure in which no binary ultra-thin film is interposed, and hence the presence of the binary ultra-thin film does not substantially affect the function of the strained quantum well structure, as detailed below.

FIG. 7 shows normalized efficiency of injected current as a function of the number of atomic layers. In the figure, the efficiency of injected current of the semiconductor optical device having a strained quantum well structure according to the present invention is normalized by obtaining the ratio of the efficiency of injection current having different numbers of atomic layers to the efficiency of injected current of the semiconductor optical device having the conventional strained quantum well structure in which no binary ultra-thin film is interposed. As shown in the figure, the number 10 of the atomic layers is critical for the normalized efficiency, which comes closer to unity as the number reduces from 10 to zero.

According to the present invention, the binary ultra-thin film formed on one strained layer terminates the growth of the one strained layer, thereby preventing the one strained layer from being combined with another strained layer to form a mixed crystal thereof. As a result, the another strained layer can be grown while the composition of the another layer is well controlled, whereby the crystallinity of the quantum well structure can be improved. In addition, the crystal interface between the compressive-strained layer and the tensile-strained layer can be formed as a mirror surface. Accordingly, device characteristics of a semiconductor laser, a semiconductor optical amplifier, a photodiode or the like can be improved.

Other and further objects, features and advantages of the present invention will be more apparent from the following description.

DESCRIPTION OF THE PREFERRED EMBODIMENTS

Embodiments of the present invention will now be described in detail with reference to the accompanying drawings.

First Embodiment

Figure 2:
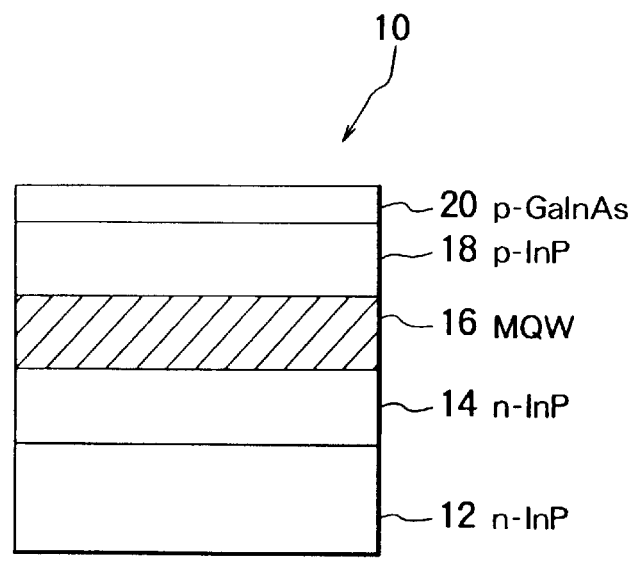
FIG. 2 is a cross sectional view of a semiconductor optical device having a strained quantum well structure according to the present invention.

Referring to FIG. 2, a semiconductor optical device 10 of the present embodiment includes an n-type InP buffer layer 14, a strained MQW 16, a 2 μm-thick p-type InP cladding layer 18, and a 30 nm-thick p-type GaInAs contact layer 20, which are formed in this order on an n-type InP substrate 12.

The MQW 16 has a structure shown in FIG. 3A, including a 100 nm-thick bottom undoped GaInAsP layer ($\lambda$g=1.1 μm) 22, three combinations each including an undoped binary ultra-thin InP film 24 (hereinafter referred to as InP intermediate film for simplification) having five atomic layers, a 20 nm-thick undoped $In_{1-x}Ga_xP$ layer (x=0.08) 26, another undoped InP film 24 and a 10 nm-thick $InAs_yP_{1-y}$ layer 28, which are laminated in cyclic order on the n-type buffer layer 14, a pair of another InP intermediate film 24 and another 20 nm-thick undoped $In_{1-x}Ga_xP$ layer 26 formed on the top of the combination layers, and a 100 nm-thick undoped GaAsInP layer 30 ($\lambda g=1.1$ μm) formed on the pair of layers.

In the present embodiment, the $In_{1-x}Ga_xP$ layer 26 has a tensile strain of 0.56% acting parallel to the main surface of the substrate to form a barrier layer while the $InAs_yP_{1-y}$ layer 28 has a compressive strain of 1.45% acting parallel to the main surface of the substrate to form a quantum well layer, thereby compensating for the tensile strain of the $In_{1-x}Ga_xP$ layer 26 in the MQW 16.

Figure 3A:
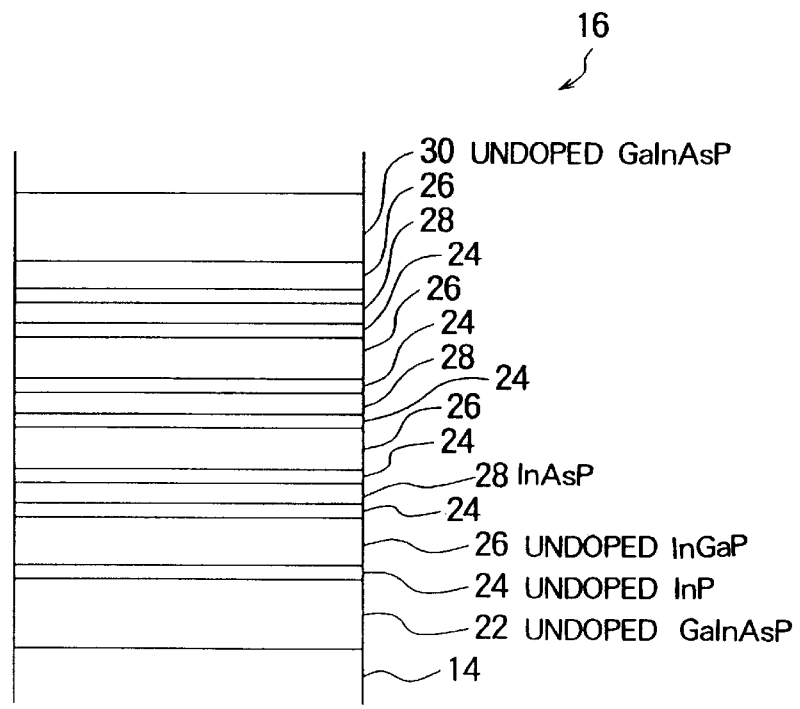
FIG. 3A is a cross sectional view of the MQW in the semiconductor optical device shown in FIG. 2.
Figure 3B:
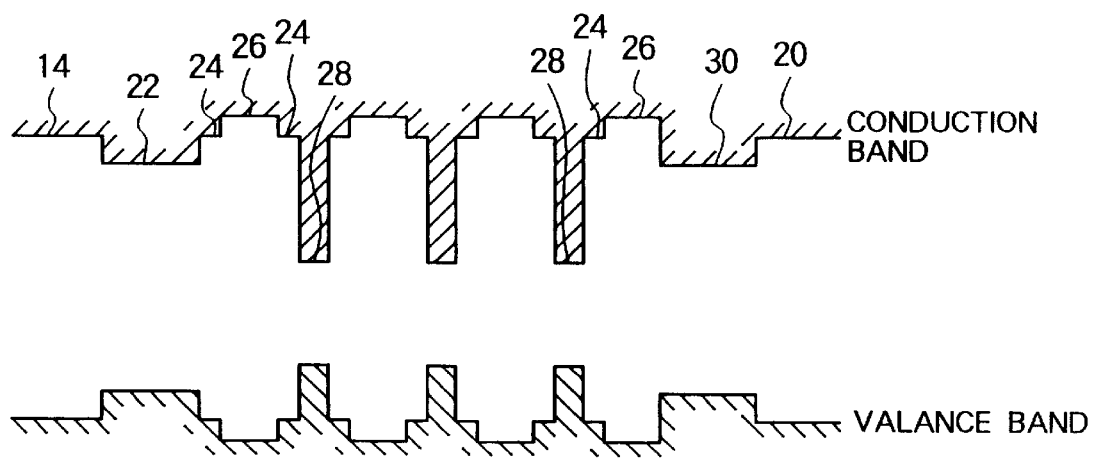
FIG. 3B is a schematic illustration showing a band structure of the MQW shown in FIG. 3A.

FIG. 3B shows a band structure of the MQW 16 described above. As apparent from FIG. 3B, the band gap of each InP intermediate layer 24 is slightly smaller than that of each $In_{1-x}Ga_xP$ layer 26, and also is significantly greater than that of each $InAs_yP_{1-y}$ layer 28.

The MQW 16 according to the present embodiment can be grown by either a metallo-organic chemical vapor deposition (MOCVD), a metallo-organic vapor phase epitaxial growth (MOVPE) or a chemical beam epitaxial growth (CBE) technology.

Both the half-width at half maximum of the photoluminescence spectrum (FWHM) and the current density threshold were measured to evaluate the laser characteristics of the semiconductor optical device 10. In addition, an X-ray diffraction analysis was carried out to examine the crystallinity of the MQW 16.

For the measurements, a plurality of InP intermediate films 24 having different thicknesses from one another were prepared first, then the FWHM of the photoluminescence spectrum for the InP intermediate films is measured in association with the thicknesses thereof. The results of the measurements are shown in FIG. 4.

Figure 4:
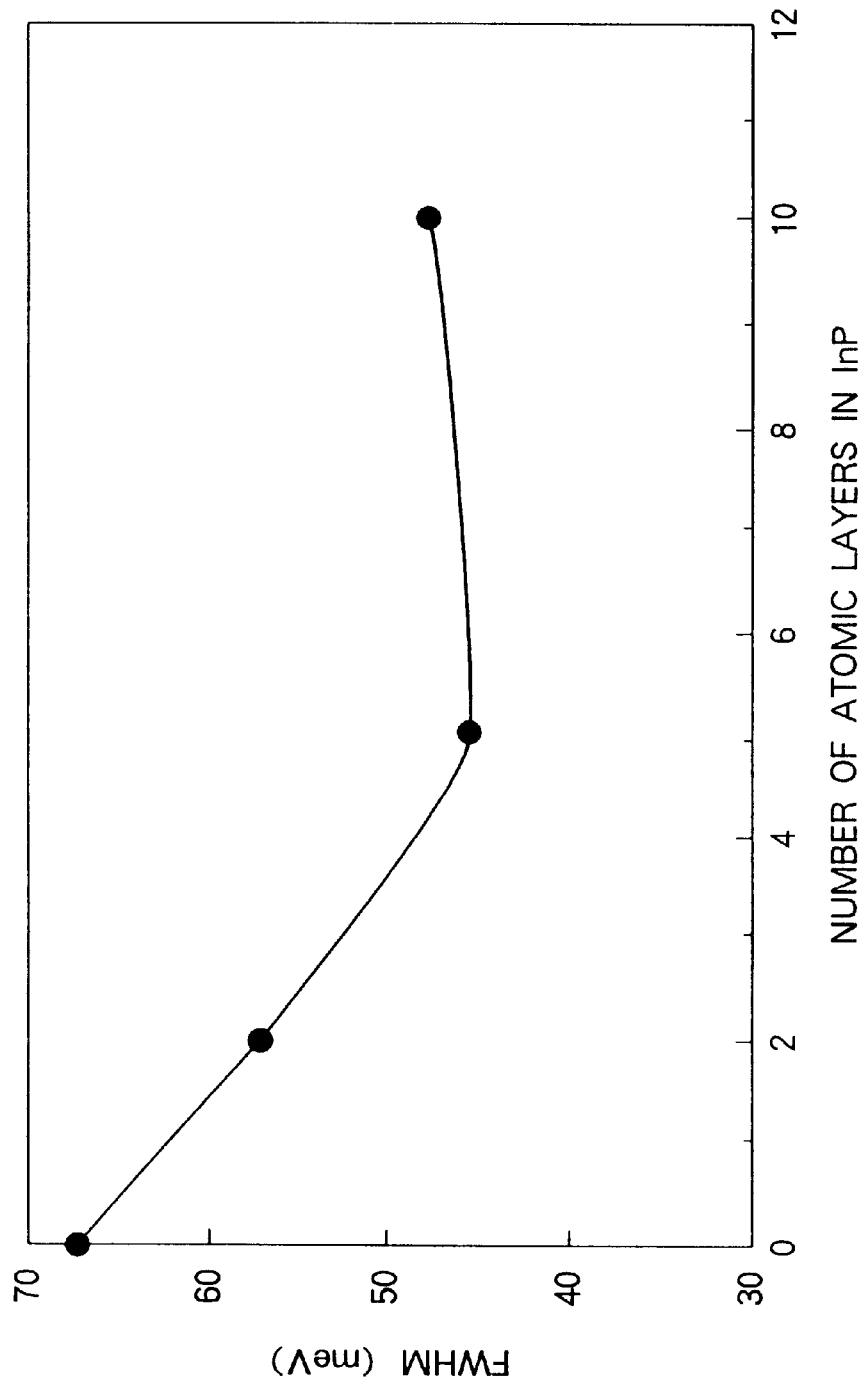
FIG. 4 is a graphical representation showing the relationship between a thickness of an InP intermediate layer and the half-width of the photoluminescence spectrum (FWHM)

As will be understood from FIG. 4, if the InP intermediate film 24 is provided in a thickness of a few atomic layers, the half-width significantly decreases, so that the laser characteristics of the semiconductor optical device 10, i.e., the crystallinity of the compound semiconductor active layers of the MQW 16 are significantly improved. In addition, it is understood from FIG. 4 that even when the thickness of the InP intermediate layer 24 reaches ten atomic layers, the decreased half-width is substantially maintained.

Figure 5A:
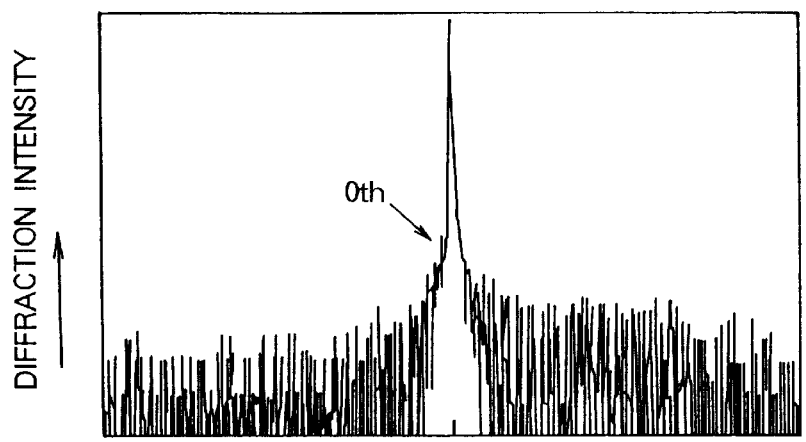
FIG. 5A is a rocking curve of an X-ray diffraction obtained by an InP ultra-thin film having a thickness of two atomic layers.
Figure 5B:
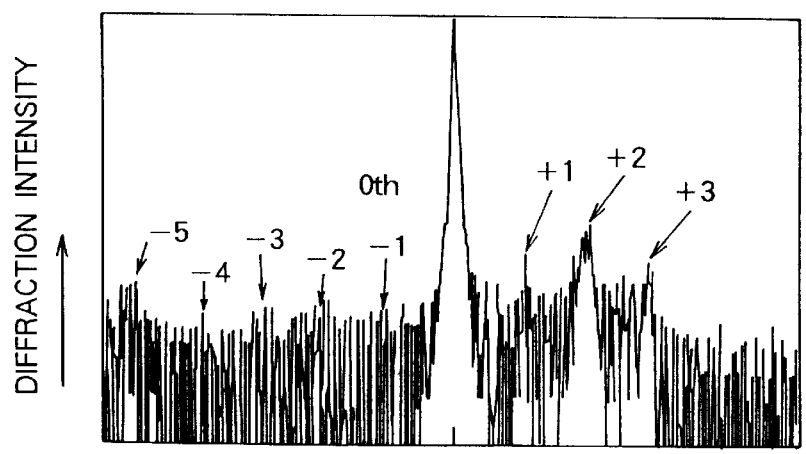
FIG. 5B is a rocking curve of an X-ray diffraction obtained by an InP ultra-thin film having a thickness of five atomic layers.
Figure 5C:
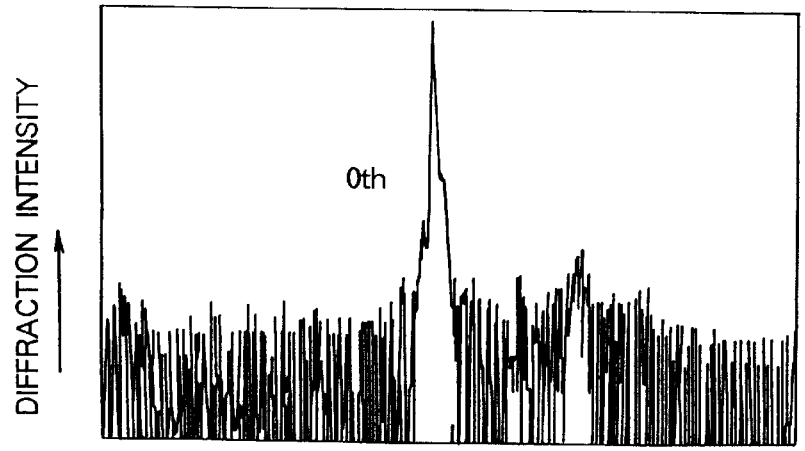
FIG. 5C is a rocking curve of an X-ray diffraction obtained by an InP ultra-thin film having a thickness of ten atomic layers.

Three types of MQW structures including different thicknesses of the InP intermediate film 24 having two atomic layers, five atomic layers and ten atom layers are grown, and an X-ray diffraction analysis was carried out for these MQW structures. FIGS. 5A, 5B and 5C show three rocking curves of the X-ray diffraction. In FIGS. 5A–5C, the axis of ordinate represents the diffraction intensity and the axis of abscissa represents the diffraction angle.

When the InP intermediate film 24 having a thickness of five atomic layers is interposed between MQW active layers, high order satellite peaks can be clearly observed, as shown in FIG. 5B at numbers +1, −1, +2, −2 etc. This means that both the crystallinity and the laser characteristics of the $In_{1-x}Ga_xP$ layer 26 and the $InAs_yP_{1-y}$ layer 28 of the MQW structure are improved in accordance with the decrease in the half-width of the photoluminescence spectrum. In addition, it was observed that each crystal plane of the active layers was formed as a mirror surface, which was obtained by the interposition of the InP intermediate layer 24 having a thickness of two atomic layers.

Figure 6:
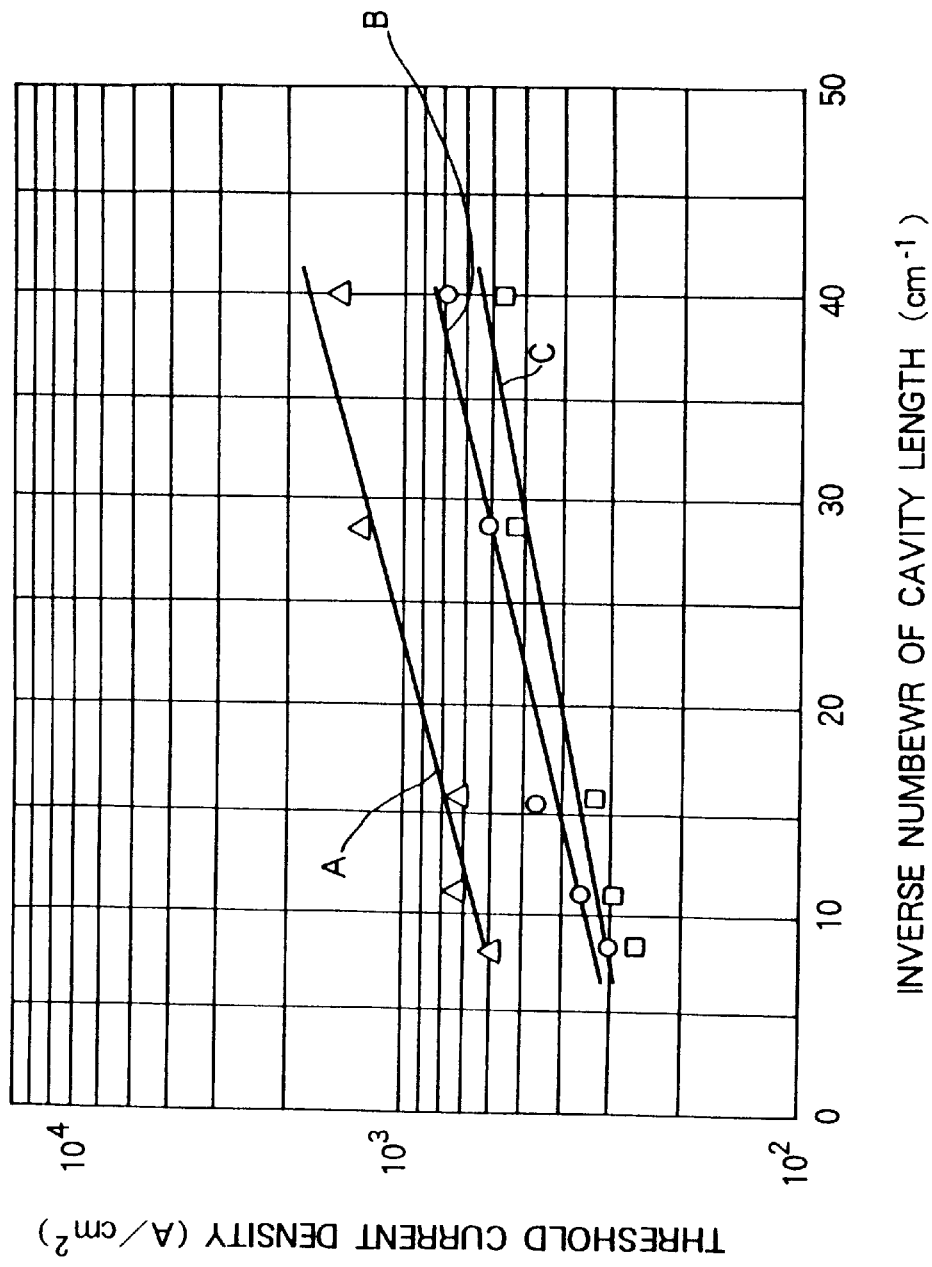
FIG. 6 is a graphical representation showing the relationship between the inverse number of a cavity length and the current density threshold.
Figure 7:
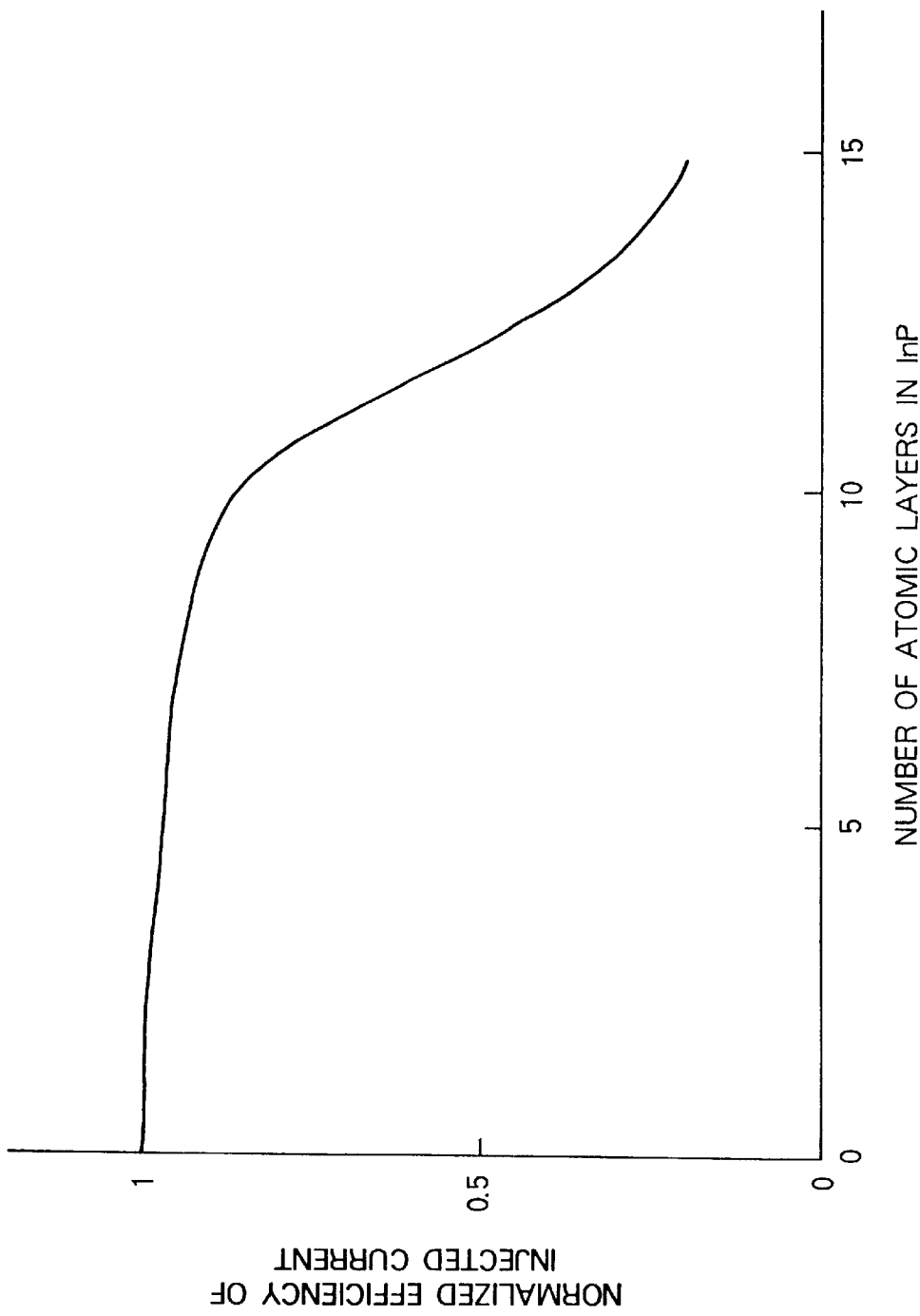
FIG. 7 is a graphical representation showing the normalized efficiency of the semiconductor optical device as a function of the number of atomic layers in the ultra-thin film.

Further, the semiconductor optical device 10 of the first embodiment was fabricated as a sample of semiconductor laser for measurement of the characteristics. It was observed that the semiconductor laser lased at a 1.3 μm wavelength. The relationship between the inverse number of a cavity length and the current density threshold obtained by the measurement is shown by line B in FIG. 6.

Figure 1:
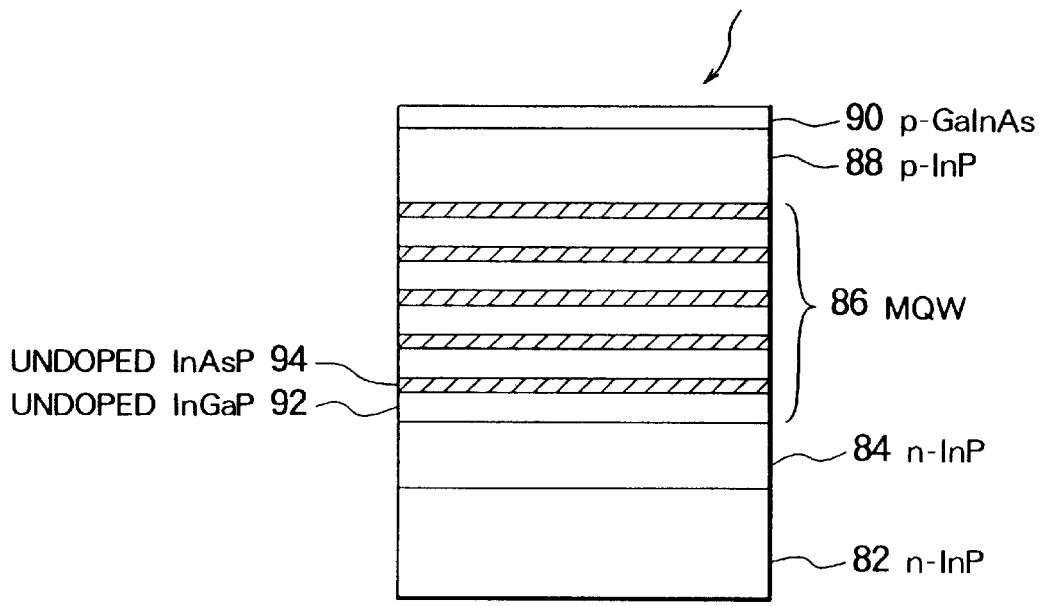
FIG. 1 is a cross sectional view of a semiconductor optical device having a conventional strained quantum well structure.

The threshold current density of the conventional semiconductor laser shown in FIG. 1, which is called as a first comparative sample herein, is measured similarly. The first comparative sample did not lase in the range of the current density shown on the axis of ordinate in FIG. 6. A second comparative sample was further fabricated which had a structure similar to that of the first comparative sample except that the value Y for the undoped $InAs_yP_{1-y}$ layer 28 in the second comparative sample was selected at 0.31 instead of 0.45 in the first comparative sample. The second comparative sample lased at a 1.2 μm wavelength. The threshold current density measured for the second comparative sample is indicated by line A in FIG. 6.

From the comparison between the lines A and B, it will be understood that the threshold current density of the semiconductor laser according to the first embodiment is as low as about half that of the second comparative sample.

Accordingly, it can be said that the semiconductor laser according to the first embodiment had excellent laser characteristics compared to the semiconductor laser having the conventional strain quantum well structure.

Second Embodiment

A semiconductor optical device or semiconductor laser according to the present embodiment has a layer structure similar to that of the semiconductor optical device 10 according to the first embodiment except that the value Y for the 10 nm-thick $InAs_yP_{1-y}$ layer 28 in the second embodiment was 0.3 instead of 0.45 in the first embodiment.

Therefore, the semiconductor laser of the present embodiment has a layer structure similar to that of the second comparative sample except that the MQW 16 of the present embodiment includes the undoped GaInAsP layer 22, the InP intermediate layer 24 and the undoped GaInAsP layer 30. A sample of the semiconductor laser of the present embodiment was fabricated and compared with the second comparative sample.

The sample of the second embodiment lased at a 1.2 μm wavelength and laser characteristics therefor were evaluated. The sample of the present embodiment had a current density threshold shown by line C in FIG. 6.

From the comparison between the lines A and C, it will be understood that the current density threshold of the second embodiment is about ⅓ of the current density threshold of the second comparative sample.

Accordingly, it can be said that the semiconductor laser of the second embodiment had excellent laser characteristics compared to the conventional semiconductor laser.

Third Embodiment

A semiconductor optical device or semiconductor laser according to a third embodiment has a strained quantum well structure including InGaAsP layers having a quaternary compound mixed crystal structure.

The semiconductor laser of the present embodiment has a layer structure shown in FIGS. 2 and FIG. 3A, and the substrate and compound semiconductor layers are made of the following materials:

Substrate 10: InP

Buffer layer 12: InP (thickness: 1 μm)

Light confinement layer: $In_xGa_{1-x}As_yP_{1-y}$ (X=0.87, Y=0.28, thickness: 0.1 μm)

MQW 16: five combinations

Well: $In_xGa_{1-x}As_yP_{1-y}$ (compressive strain: 1.4%, X=0.95, Y=0.6, thickness: 5 nm, the number of wells: 5)

Barrier: $In_xGa_{1-x}As_yP_{1-y}$ (tensile strain: 0.5%, X=0.85, Y=0.28, thickness: 12 nm)

Intermediate film: InP (thickness: 5 atomic layers)

Cladding layer 18: InP (thickness: 1.5 μm)

Contact layer 20: InGaAs (thickness: 0.2 μm)

As a result of measuring the current density threshold of the semiconductor laser of the third embodiment, it was revealed that the laser lased at a 1.3 μm wavelength, the cavity length was 1,000 μm and the current density threshold was 350 A/cm². Accordingly, it can be said that the semiconductor laser of the present embodiment had superior laser characteristics compared to the conventional semiconductor laser.

Fourth Embodiment

A semiconductor optical device or semiconductor laser according to a fourth embodiment has a strained quantum well structure including GaAs layers having a binary compound mixed crystal structure.

The semiconductor laser of the present embodiment has a layer structure shown in FIGS. 2 and FIG. 3A, and the substrate and compound semiconductor layers thereof are made of the following materials:

Substrate 12: GaAs

Buffer layer 14: $Al_xGaAs$ (X=0.3, thickness: 1.5 μm)

Light confinement layer: $Al_xGaAs$ (X=0.1, thickness: 0.1 μm)

MQW 16: two cyclic combinations

Well: InGaAs (compressive strain: 1%, thickness: 8 nm)

Barrier: GaAsP (tensile strain: 0.5%, thickness: 10 nm)

Intermediate film: GaAs (thickness: 3 atomic layers)

Cladding layer 18: $Al_xGaAs$ (X=0.3, thickness: 1.5 μm)

Contact layer 20: AlGaAs (thickness: 0.2 μm)

As a result of measuring the threshold current density of the semiconductor laser of the embodiment 5, it was revealed that the laser lased at a 0.98 μm wavelength, the cavity length was 1,000 μm and the current density threshold is 150 A/cm². Accordingly, it can be said that the semiconductor laser of the present embodiment had excellent laser characteristics compared to the conventional semiconductor laser.

It was confirmed that similar advantages can be obtained in other MQW structures formed of InGaAs/InGaAsP and InGaAs/GaAsP layers.

Since above embodiments are described only for examples, the present invention is not limited to such embodiments and it will be obvious for those skilled in the art that various modifications or alterations can be easily made based on the above embodiments within the scope of the present invention.

What is claimed is:

1. A semiconductor optical device comprising a substrate made of a first binary compound semiconductor, a strained quantum well structure overlying said substrate and including at least one layer combination, said layer combination having a well layer and a barrier layer, and an ultra-thin film interposed between said well layer and barrier layer, said ultra-thin film being made of said first binary compound semiconductor and having a thickness not exceeding ten atomic layers.

2. A semiconductor optical device as defined in claim 1 wherein said first binary compound semiconductor is a III–V compound semiconductor.

3. A semiconductor optical device as defined in claim 1 wherein another ultra-thin film is interposed between said substrate and said strained quantum well structure, said another ultra-thin film being made of said first binary compound semiconductor.

4. A semiconductor optical device as defined in claim 1 wherein said ultra-thin film has a thickness between a first thickness corresponding to a monoatomic layer and a second thickness corresponding to ten atomic layers.

5. A semiconductor optical device as defined in claim 1 wherein said at least one layer combination include a plurality of combination layers whereby said strained quantum well structure has a multiple-quantum well structure.

6. A semiconductor optical device as defined in claim 1 wherein said well layer and barrier layer are compressive-strained and tensile-strained, respectively.

7. A semiconductor optical device as defined in claim 1 wherein said well layer and barrier layer are tensile-strained and compressive-strained, respectively.

8. A semiconductor optical device comprising a substrate made of a first binary compound semiconductor, a strained quantum well structure overlying said substrate and including at least one layer combination, said layer combination having a well layer and a barrier layer, and an ultra-thin film interposed between said well layer and barrier layer, said ultra-thin film being made of said first binary compound semiconductor and having a thickness not exceeding ten atomic layers, wherein one of said well layer and said barrier layer is tensile strained and the other is compressive-strained.

9. A semiconductor optical device according to claim 8 wherein said well layer is compressive-strained between 1% and 1.45% and said barrier layer is tensile-strained between 0.5% and 0.56%.

10. A semiconductor optical device according to claim 8 wherein the substrate and the ultra thin layer are GaAs, the well layer is InGaAs, and the barrier layer is GaAsP.

11. A semiconductor substrate according to claim 8 wherein the ultra thin layer and the substrate are lattice-matched.

12. A semiconductor optical device according to claim 8 wherein the substrate and the ultra thin layer are InP, the well layer is InAsP, and the barrier layer is InGaP.

* * * * *